(12) United States Patent
Byun (10) Patent No.: US 8,941,101 B2
(45) Date of Patent: Jan. 27, 2015

(54) ORGANIC LIGHT EMITTING DIODE DISPLAY AND METHOD FOR MANUFACTURING ORGANIC LIGHT EMITTING DIODE DISPLAY

(71) Applicant: Samsung Display Co., Ltd., Yongin-City, Gyeonggi-Do (KR)

(72) Inventor: Ki-Yeol Byun, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/934,921

(22) Filed: Jul. 3, 2013

(65) Prior Publication Data

US 2014/0097415 A1 Apr. 10, 2014

(30) Foreign Application Priority Data

Oct. 10, 2012 (KR) .......................... 10-2012-0112470

(51) Int. Cl.
| | |
|---|---|
| H01L 35/24 | (2006.01) |
| H01L 51/00 | (2006.01) |
| H01L 51/52 | (2006.01) |
| H01L 51/56 | (2006.01) |
| H05B 33/08 | (2006.01) |
| H01L 27/32 | (2006.01) |

(52) U.S. Cl.
CPC ............ *H01L 51/5203* (2013.01); *H01L 51/56* (2013.01); *H05B 33/0896* (2013.01); *H01L 27/3262* (2013.01)
USPC .................................. 257/40; 257/43; 438/34

(58) Field of Classification Search
USPC ............... 257/40, 43, 59, 88, E27.12; 438/34
See application file for complete search history.

(56) References Cited

U.S. PATENT DOCUMENTS

| | | | |
|---|---|---|---|
| 2005/0042833 A1 | 2/2005 | Park et al. | |
| 2005/0258487 A1* | 11/2005 | Suh et al. | ........................ 257/347 |
| 2005/0285108 A1* | 12/2005 | Choi | ................................ 257/59 |
| 2014/0070184 A1* | 3/2014 | Shin | ................................ 257/40 |

FOREIGN PATENT DOCUMENTS

| | | |
|---|---|---|
| KR | 10-0317638 B1 | 12/2001 |
| KR | 10-1015849 B1 | 2/2011 |

\* cited by examiner

*Primary Examiner* — Phuc Dang
(74) *Attorney, Agent, or Firm* — Knobbe, Martens, Olson & Bear, LLP (57) ABSTRACT

An organic light emitting diode (OLED) display is disclosed. In one aspect, the display includes a substrate, an organic light emitting element positioned on the substrate, and a first thin film transistor (TFT) connected to the organic light emitting element and having a driving channel region including at least one groove.

16 Claims, 9 Drawing Sheets

ORGANIC LIGHT EMITTING DIODE DISPLAY AND METHOD FOR MANUFACTURING ORGANIC LIGHT EMITTING DIODE DISPLAY

RELATED APPLICATIONS

This application claims priority to and the benefit of Korean Patent Application No. 10-2012-0112470 filed in the Korean Intellectual Property Office on Oct. 10, 2012, the entire contents of which are incorporated herein by reference.

BACKGROUND

1. Field

The described technology generally relates to an organic light emitting diode (OLED) display and a manufacturing method of the display.

2. Description of the Related Technology

Recently, an OLED display has received much attention as a display device for displaying images.

The OLED display has a self-emission characteristic, eliminating the necessity for a light source, unlike a liquid crystal display (LCD) device, and thus can be fabricated to be thinner and lighter. Also, the OLED display has high quality characteristics such as low power consumption, high luminance, high response speed, and the like.

SUMMARY

One inventive aspect is an organic light emitting diode (OLED) display including a first thin film transistor connected to an OLED, and a manufacturing method of the OLED display.

Another aspect is an organic light emitting diode (OLED) display having a sufficient grayscale of light emitted from an organic emission layer to improve display quality.

Another aspect is an organic light emitting diode (OLED) display which includes: a substrate; an organic light emitting element positioned on the substrate; and a first thin film transistor connected to the organic light emitting element and having a driving channel region including at least one groove.

A second thin film transistor connected to the first thin film transistor and including a switching channel region may be further included.

The driving channel region and the switching channel region may be positioned with the same layer on the substrate.

The first thin film transistor may further include a first gate electrode positioned on the driving channel region and positioned in the groove, and the second thin film transistor further may include a second gate electrode positioned on the switching channel region.

The surface of the switching channel region may be flat.

The groove may be formed with a curved surface.

The organic light emitting element may include a first electrode connected to the first thin film transistor, an organic emission layer positioned on the first electrode, and a second electrode positioned on the organic emission layer.

Another aspect is a manufacturing method of an organic light emitting diode (OLED) display which includes forming a first thin film transistor including a driving channel region having at least one groove on a substrate, and forming an organic light emitting element connected to the first thin film transistor.

The method may further include forming a second thin film transistor connected to the first thin film transistor and including a switching channel region.

The forming of the first thin film transistor and the forming of the second thin film transistor may be performed with the same process.

The forming of the first thin film transistor and the forming of the second thin film transistor may include: forming a driving active layer and a switching active layer on the substrate; forming a mask insulation layer including an opening positioned corresponding to a position where a groove will be formed on the driving active layer and the switching active layer; dry-etching the driving active layer through the opening to form a preliminary groove at the driving active layer; dry-etching the driving active layer through the opening to expand the preliminary groove thereby forming the groove; and removing the mask insulation layer.

The preliminary groove may be formed as a plane, and the groove may be formed with a curved surface.

DETAILED DESCRIPTION

Generally, an OLED display includes gate wires positioned on a substrate and extending in one direction, data wires extending in a direction crossing the gate wires, a plurality of thin film transistors (TFTs) connected to the gate wires and the data wires, and organic light emitting elements connected to the TFTs.

Recently, improvements in forming the channel region of a TFT have led to improved driving capabilities. However, since a driving range (DR) of the gate voltage applied to the gate electrode of a TFT is very narrow, a grayscale of light emitted from the OLED is narrow, thus leading to a loss in emission quality.

Hereinafter, embodiments will be described more fully with reference to the accompanying drawings. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

Further, since sizes and thicknesses of constituent members shown in the accompanying drawings are arbitrarily given for better understanding and ease of description, the present invention is not limited to the illustrated sizes and thicknesses.

In the drawings, the thickness of layers, films, panels, regions, etc., may be exaggerated for clarity. In the drawings, for better understanding and ease of description, the thicknesses of some layers and areas are exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Further, throughout the specification, "on" implies being positioned above or below a target element and does not imply being necessarily positioned on the top on the basis of a gravity direction.

Figure 1:
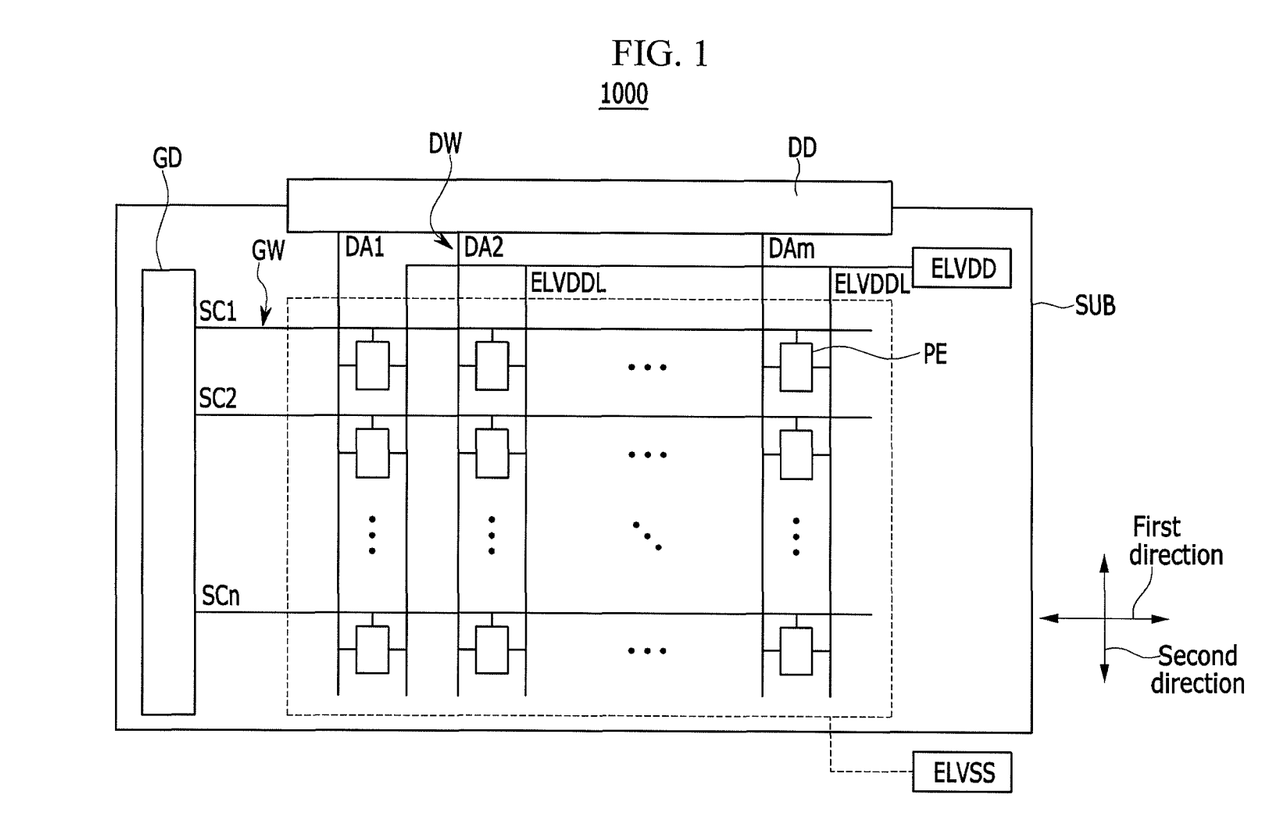
FIG. 1 is a view of an organic light emitting diode (OLED) display according to a first embodiment.

FIG. 1 is a view of an organic light emitting diode display according to a first embodiment.

As shown in FIG. 1, an OLED display 1000 includes a substrate SUB, a gate driver GD, gate wires GW, a data driver DD, data wires DW, and a pixel PE. Here, the pixel PE is a minimum unit displaying an image, and the OLED display 1000 displays the image through a plurality of pixels PE.

The substrate SUB may be formed of a transparent light transmissive substrate made of glass, quartz, ceramic, or plastic. However, the substrate SUB can be formed as a metallic substrate made of stainless steel. Further, when the substrate SUB is made of plastic, the OLED display 1000 can be flexible, rollable, or stretchable.

The gate driver GD sequentially supplies a scan signal to the gate wires GW corresponding to a control signal supplied by a control circuit (not shown), for example, a timing controller. The pixel PE is selected by the scan signal to sequentially receive a data signal.

The gate wires GW are positioned on the substrate SUB and extend in the first direction. The gate wires GW include scan lines S1-SCn, and the scan lines S1-SCn are connected to the gate driver GD to receive scan signals from the gate driver GD.

In one embodiment, the gate wires GW include the scan lines S1-SCn. The gate wires may further include an additional scan line, an initial power source line, and a light emission control line. In this case, the OLED display can be an active matrix (AM) type of OLED display with a 6Tr-2Cap structure.

The data driver DD supplies a data signal to a data line DAm from among the data wires DW corresponding to a control signal supplied by the timing controller. The data signal supplied to the data line DAm is supplied to the pixel PE selected by the scan signal when the scan signal is supplied to the scan line SCn. The pixel PE is charged with a voltage corresponding to the data signal and emits light with corresponding luminance.

The data wires DW are positioned on the gate wires GW, however they may be positioned between the gate wires GW and the substrate SUB and may extend in the second direction crossing the first direction. The data wires DW include the data lines DA1-DAm and a driving power source line ELVDDL. The data lines DAm are connected to the data driver DD and receive the data signal from the data driver DD. The driving power source line ELVDDL is connected to the first power source ELVDD from the outside and receives driving power from the first power source ELVDD.

The pixel PE is positioned at a region where the gate wires GW and the data wires DW are crossed, and includes an organic light emitting element emitted with a luminance corresponding to the driving current according to the data signal, a plurality of thin film transistors to control a driving current flowing in the organic light emitting element, and at least one capacitor. A plurality of thin film transistors and at least one capacitor are respectively connected to the gate wires GW and the data wires DW, and the organic light emitting element is connected to a plurality of thin film transistors and at least one capacitor. The organic light emitting element is connected between the first power source ELVDD and the second power source ELVSS.

Figure 2:
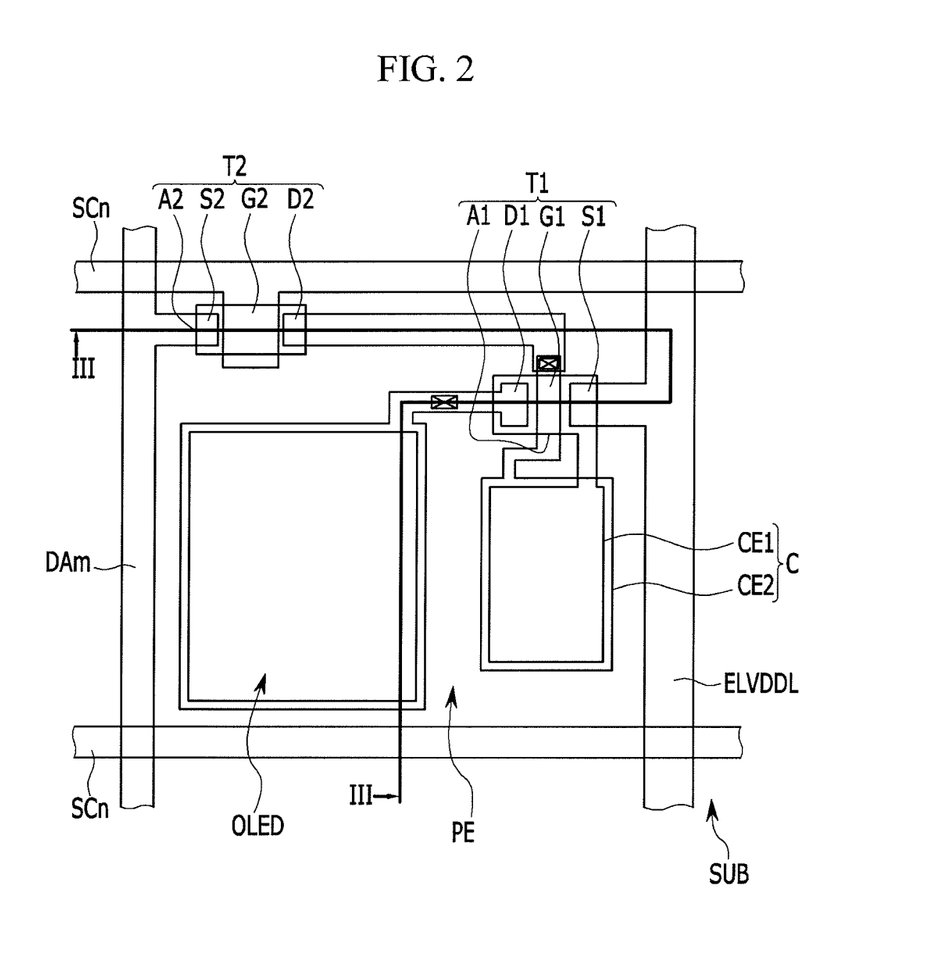
FIG. 2 is a layout view of a pixel part shown in FIG. 1.
Figure 3:
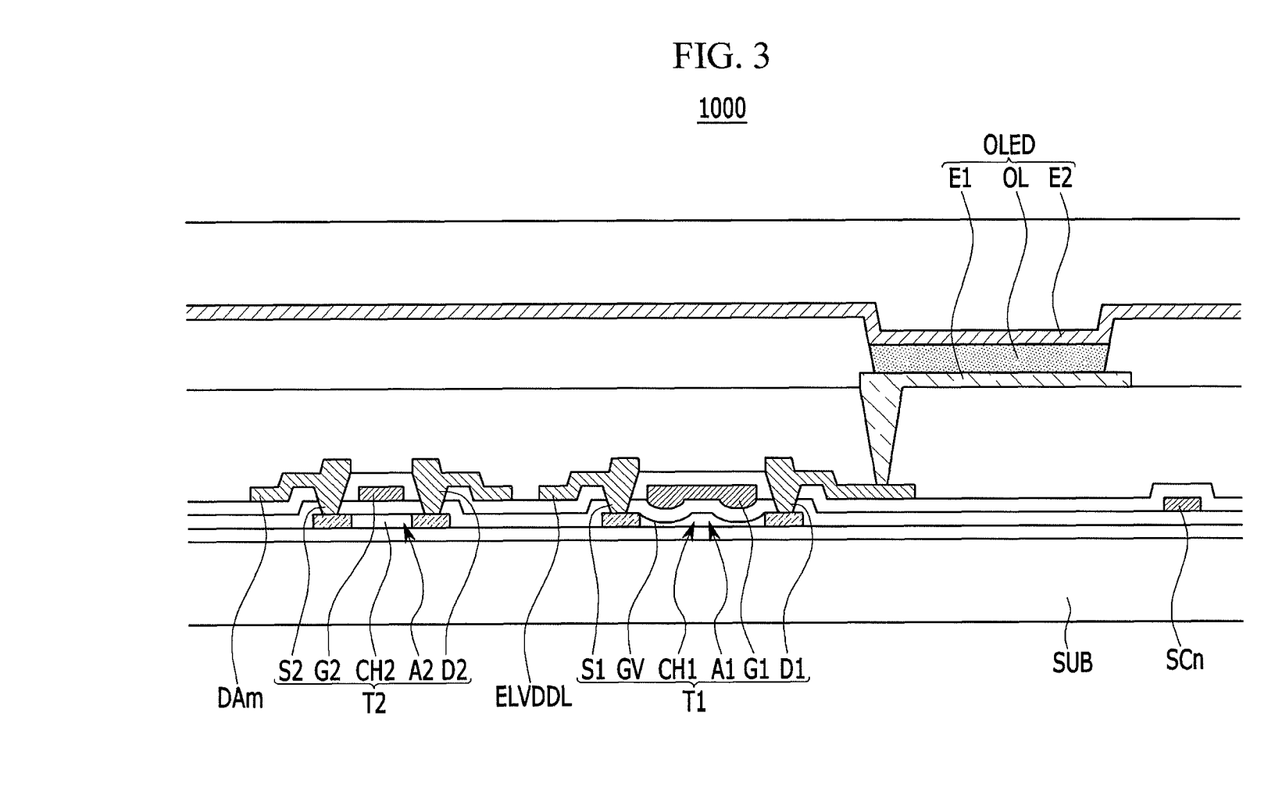
FIG. 3 is a cross-sectional view taken along the line III-III of FIG. 2.

FIG. 2 shows a layout view indicating a pixel part shown in FIG. 1. FIG. 3 is a cross-sectional view taken along the line III-III of FIG. 2.

As shown in FIG. 2 and FIG. 3, the pixel PE includes a pixel circuit including the organic light emitting element connected between the first power source ELVDD and the second power source ELVSS, and two thin film transistors and one capacitor connected between the organic light emitting element and the first power source ELVDD to control a driving power source supplied to the organic light emitting element.

The organic light emitting element includes the first electrode E1, an organic emission layer OL positioned on the first electrode E1, and the second electrode E2 positioned on the organic emission layer OL. The first electrode E1 as an anode of the organic light emitting element is connected to the driving power line ELVDDL connected to the first power ELVDD through the pixel circuit, and the second electrode E2 as a cathode of the organic light emitting element is connected to the second power ELVSS. The organic emission layer OL of the organic light emitting element is supplied with the driving power through the first power ELVDD, and the light is emitted with the luminance corresponding to the driving current flowing to the organic light emitting element when supplying a common power from the second power ELVSS. The organic emission layer OL of the organic light emitting element may be formed of a low molecular weight organic material or a high molecular weight organic material such as PEDOT poly(3,4-ethylene dioxythiophene). Further, the organic emission layer OL may be formed as a multilayer including one or more of an emission layer, a hole injection layer HIL, a hole transport layer HTL, an electron transport layer ETL, and an electron injection layer EIL. In the case where all the layers are included, the hole injection layer HIL is disposed on a pixel electrode that is the anode, and the hole transport layer HTL, the emission layer, the electron transport layer ETL, and the electron injection layer EIL are sequentially laminated thereon. The organic emission layer OL may include a red organic emission layer emitting a red light, a green organic emission layer emitting green light, and a blue organic emission layer emitting blue light, and the red organic emission layer, the green organic emission layer, and the blue organic emission layer are respectively formed in a red pixel, a green pixel, and a blue pixel thereby realizing a color image. Also, the organic emission layer OL may realize the color image by depositing all of the red organic emission layer, the green organic emission layer, and the blue organic emission layer in the red pixel, the green pixel, and the blue pixel and forming a red color filter, a green color filter, and a blue color filter for each pixel. As another example, a white organic emission layer emitting white light is formed in all of the red pixel, the green pixel, and the blue pixel, and the red color filter, the green color filter, and the blue color filter are respectively formed for each pixel thereby realizing the color image. When realizing the color image by using the white organic emission layer and the color filter, it is not necessary to use a deposition mask to respectively form the red organic emission layer, the green organic emission layer, and the blue organic emission layer such that an image resolution is improved.

The pixel circuit includes the first thin film transistor T1, the second thin film transistor T2, and a capacitor C.

The first thin film transistor T1 is connected between the driving power source line ELVDDL and the first electrode E1 of the organic light emitting element and supplies the driving power source corresponding to the data signal from the first power source ELVDD to the organic light emitting element during a light emitting period of the pixel PE. That is, the first thin film transistor T1 functions as a driving transistor of the pixel PE.

The first thin film transistor T1 includes the first source electrode S1, the first drain electrode D1, a driving channel region CH1, and the first gate electrode G1.

The first source electrode S1 is connected to the driving power source line ELVDDL, and the first drain electrode D1 is separated from the first source electrode S1 via a driving channel region CH1 and is connected to the organic light emitting element. The first source electrode S1 and the first drain electrode D1 are formed with a different layer from the driving channel region CH1, however the first source electrode S1 and the first drain electrode D1 may be formed with the same layer as the driving channel region CH1. In this case, an impurity may be injected to the first source electrode S1 and the first drain electrode D1.

The driving channel region CH1 is connected to the first capacitor electrode CE1 of the capacitor C, and is positioned between the first source electrode S1 and the first drain electrode D1. The driving channel region CH1 includes a plurality of grooves GV that are depressed from a surface thereof. The grooves GV are formed with a curved surface thereby substantially forming a partial circle. The groove GV may be formed of a straight line, a curved line, or an island shape on the surface of the driving channel region, and one or a plurality of driving channel regions CH1 may be formed.

The groove GV is formed in the driving channel region CH1 such that the entire channel length of the driving channel region CH1 is increased. The driving channel region CH1 may be formed of polysilicon or an oxide semiconductor. The oxide semiconductor may be made of an oxide basically including zinc (Zn), gallium (Ga), tin (Sn), or indium (In), or a composite oxide thereof such as zinc oxide (ZnO), indium-gallium-zinc oxide (InGaZnO4), indium-zinc oxide (Zn—In—O), or zinc-tin oxide (Zn—Sn—O). When the driving channel region CH1 is formed of the oxide semiconductor, a protection layer protecting the oxide semiconductor that is weak against external environment factors such as a high temperature may be added on the driving channel region CH1. A source region and a drain region are positioned at both ends of the driving channel region CH1, and the source region and the drain region may be respectively injected with the impurity. The driving channel region CH1, the source region, and the drain region form a driving active layer A1.

The first gate electrode G1 is positioned on the driving channel region CH1 and is connected to the second drain electrode D2 of the second thin film transistor T2. The first gate electrode G1 is positioned in the groove GV.

The second thin film transistor T2 connects the data line Dam and the first thin film transistor T1. The second thin film transistor T2 transmits the data signal supplied from the data line Dam in the pixel PE when the scan signal is supplied from the scan line SCn. That is, the second thin film transistor T2 functions as the switching transistor of the pixel PE.

The second thin film transistor T2 includes the second source electrode S2, the second drain electrode D2, a switching channel region CH2, and the second gate electrode G2.

The second source electrode S2 is connected to the data line Dam and the second drain electrode D2 is connected to the first gate electrode G1 of the first thin film transistor T1. The second source electrode S2 and the second drain electrode D2 are formed with a different layer from the switching channel region CH2, however the second source electrode S2 and the second drain electrode D2 may be formed with the same layer as the switching channel region CH2. In this case, the second source electrode S2 and the second drain electrode D2 may be injected with the impurity.

The switching channel region CH2 is positioned with the island shape between the second source electrode S2 and the second drain electrode D2. The surface of the switching channel region CH2 is flat, different from the driving channel region CH1. The switching channel region CH2 has the flat surface such as the switching channel region CH2 has a shorter channel length than that of the driving channel region CH1. The switching channel region CH2 is positioned with the same layer as the driving channel region CH1 on the substrate SUB and is formed with the same material. The switching channel region CH2 may be made of polysilicon or the oxide semiconductor. The source region and the drain region are positioned at both ends of the switching channel region CH2, and the source region and the drain region may be injected with the impurity. The switching channel region CH2, the source region, and the drain region form a switching active layer A2.

The second gate electrode G2 is positioned on the switching channel region CH2 and is connected to the scan line SCn.

The capacitor C includes the first capacitor electrode CE1 and the second capacitor electrode CE2 facing each other via an insulation layer interposed therebetween. The first capacitor electrode CE1 is connected to the driving power source line ELVDDL, and the second capacitor electrode CE2 is connected to the second gate electrode G2 of the second thin film transistor T2 through the first gate electrode G1.

If the switching thin film transistor T2 is instantly turned on, the power is supplied from the driving power source line ELVDDL to the first capacitor electrode CE1 of the capacitor C and simultaneously the power is supplied to second capacitor electrode CE2 from the data line Dam through the switching thin film transistor T2 such that the capacitor C is charged. At this time, the charge amount is proportional to the voltage applied from the data line DAm. In the state that the switching thin film transistor T2 is turned off, the gate potential of the driving thin film transistor T1 is increased according to the potential charged to the capacitor C. Also, the driving thin film transistor T1 is turned on if the gate potential is over the threshold voltage. Thus, the voltage applied to the driving power source line ELVDDL is applied to the organic light emitting element through the driving thin film transistor T1 such that the organic light emitting element emits light.

The above-noted configuration of the pixel PE is not restricted to the description, and is variable in many ways within a range that is easily modifiable by a person skilled in the art.

As described above, the second thin film transistor T2 includes the switching channel region CH2 having the flat surface of which the channel length is decreased compared with the driving channel region CH1 of the first thin film transistor T1 such that the load of the driving current flowing in the pixel PE is minimized. Also, the first thin film transistor T1 controlling the driving current supplied to the organic light emitting element (OLED) substantially includes the driving channel region CH1 having at least one groove GV such that the entire channel length of the driving channel region CH1 is increased, and accordingly, when the light emitted from the organic emission layer (OL) of the organic light emitting element according to the driving current flowing in the organic light emitting element is displayed as a black color and a white color, the driving range (DR) of the gate voltage applied to the first gate electrode G1 of the first thin film transistor T1 is wide.

In one embodiment, the OLED display 1000 minimizes the load of the driving current passing through the second thin film transistor T2, and simultaneously the driving range (DR) of the first thin film transistor T1 is increased, and accordingly, light emitted from the OLED can be controlled to have sufficient grays by changing the magnitude of the gate voltage applied to the first gate electrode G1 of the first thin film transistor T1.

Recently, the number of pixels per inch (ppi) of the OLED display 1000 has increased such that the high driving range (DR) is required for the light emitted from the organic light emitting element to have sufficient grays for realizing the OLED display 1000 of the high resolution. In one embodiment, the OLED display 1000 is controlled to have sufficient grays, thereby providing the OLED display 1000 having high resolution and simultaneously improved display quality.

Also, the semiconductor characteristic of the driving channel region CH1 of the first thin film transistor T1 is poor due to the groove GV, and since the first thin film transistor T1 requires the high threshold voltage compared with the second thin film transistor T2, undesired light emitting of the organic light emitting element is suppressed in the low grayscale region such that spots generated in the image displayed by the organic light emitting element are minimized.

Also, the switching channel region CH2 of the second thin film transistor T2 that is the switching thin film transistor among a plurality of thin film transistors has a short channel length such that the semiconductor characteristic is good compared with the driving channel region CH1. Accordingly, each charge mobility of the second thin film transistor T2 is increased, and simultaneously the threshold voltage is decreased, and thereby the second thin film transistor T2 may perform the turn-on and the turn-off with a fast speed. Therefore, the load of the current flowing in the entire OLED display 1000 is minimized such that the display quality of the OLED display 1000 is improved. That is, the OLED display 1000 having the high resolution and simultaneously the improved display quality is provided.

Next, a manufacturing method of an OLED display according to a second embodiment will be described with reference to FIG. 4 to FIG. 9. The OLED display 1000 according to the first embodiment may be manufactured by the method of the second embodiment.

Figure 4:
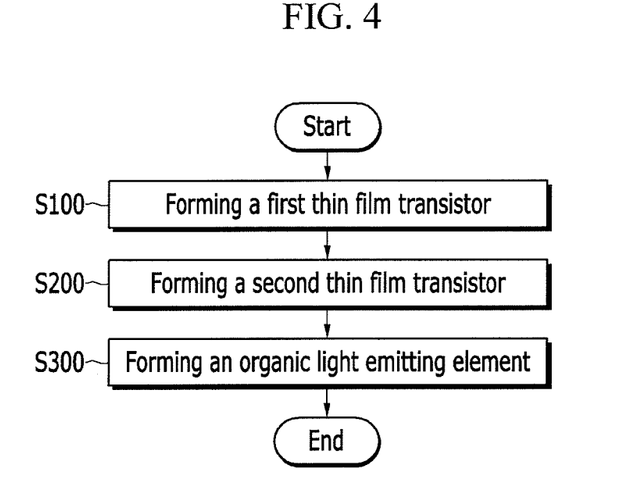
FIG. 4 is a flowchart of a manufacturing method of an organic light emitting diode (OLED) display according to a second embodiment.

FIG. 4 is a flowchart of a manufacturing method of an OLED display according to the second embodiment. FIG. 5 to FIG. 9 are views to explain a manufacturing method of an OLED display according to the second embodiment.

Firstly, as shown in FIG. 4, the first thin film transistor and the second thin film transistor formed with the same process (S100 and S200).

Figure 5:
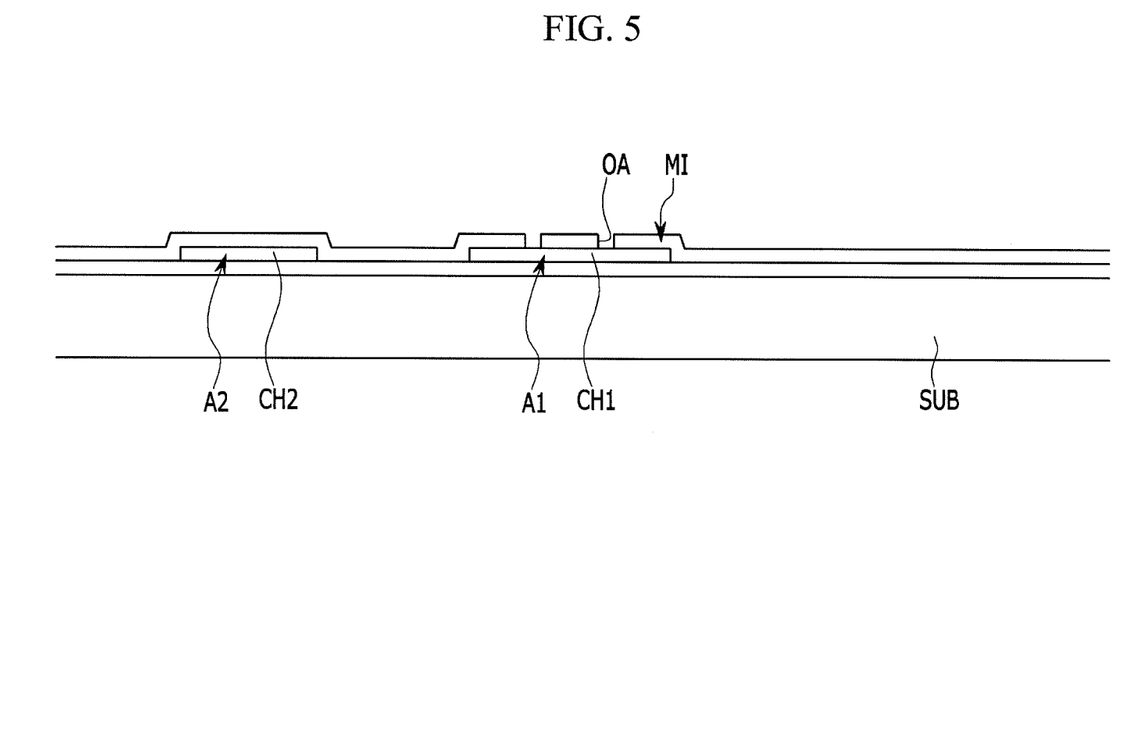
FIG. 5 to FIG. 9 are views to explain a manufacturing method of an organic light emitting diode (OLED) display according to the second embodiment.

In detail, firstly, as shown in FIG. 5, a driving active layer A1 and a switching active layer A2 are formed on a substrate SUB. The driving active layer A1 and the switching active layer A2 are made of polysilicon or the oxide semiconductor.

Next, a mask insulation layer MI having openings OA positioned corresponding to a position where the above-described groove will be formed is formed on the driving active layer A1 and the switching active layer A2. The mask insulation layer MI may include an inorganic material such as silicon nitride or silicon oxide.

Figure 6:
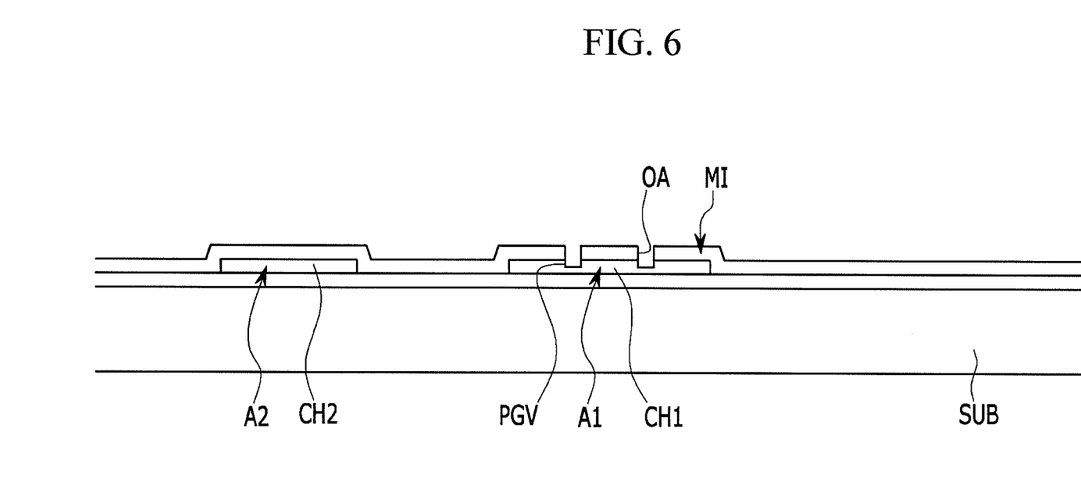

Next, as shown in FIG. 6, by using an etching means such as plasma or an ion beam, the driving active layer A1 is dry-etched through the opening OA to form a preliminary groove PSV at the driving channel region CH1 of the driving active layer A1. The preliminary groove PSV is formed in a plane according to a characteristic of the dry etching. The preliminary groove PSV may have a polygonal shape such as a quadrangle or a triangle.

Figure 7:
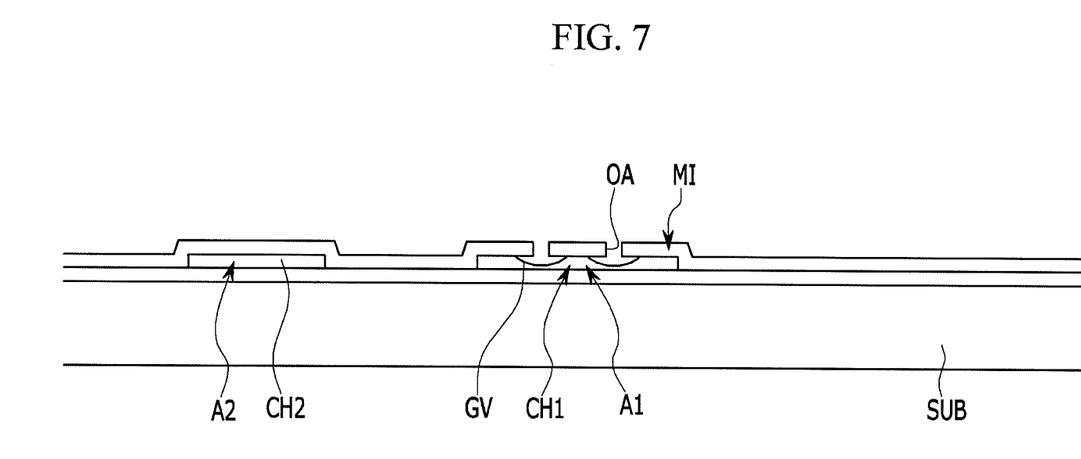

Next, as shown in FIG. 7, by using an etching means such as an etchant, the driving active layer A1 is dry-etched through the opening OA to expand the preliminary groove PSV of the driving channel region CH1 of the driving active layer A1 thereby forming a groove GV. The groove GV is formed with a curved surface according to the characteristic of the dry etching. The groove GV may have a circular shape.

Figure 8:
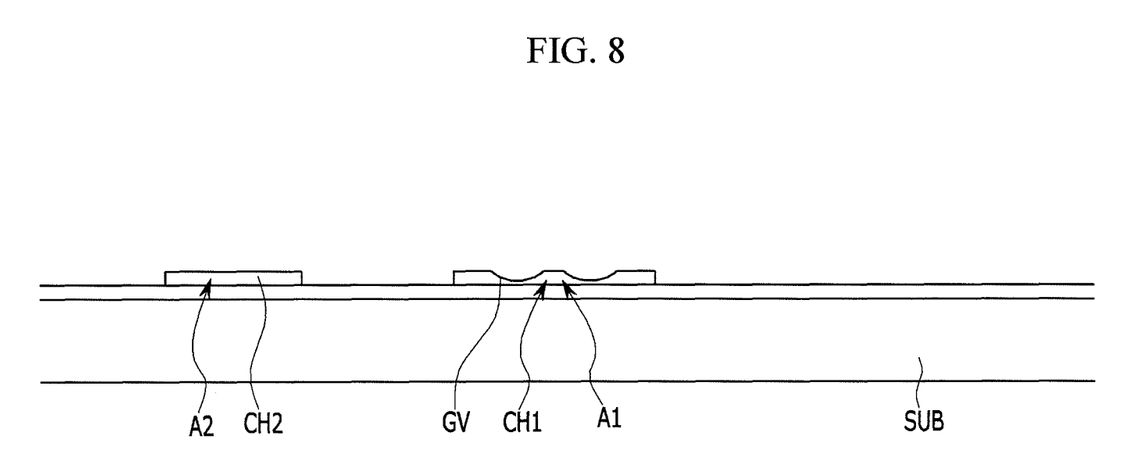

Next, as shown in FIG. 8, the mask insulation layer MI is removed.

Figure 9:
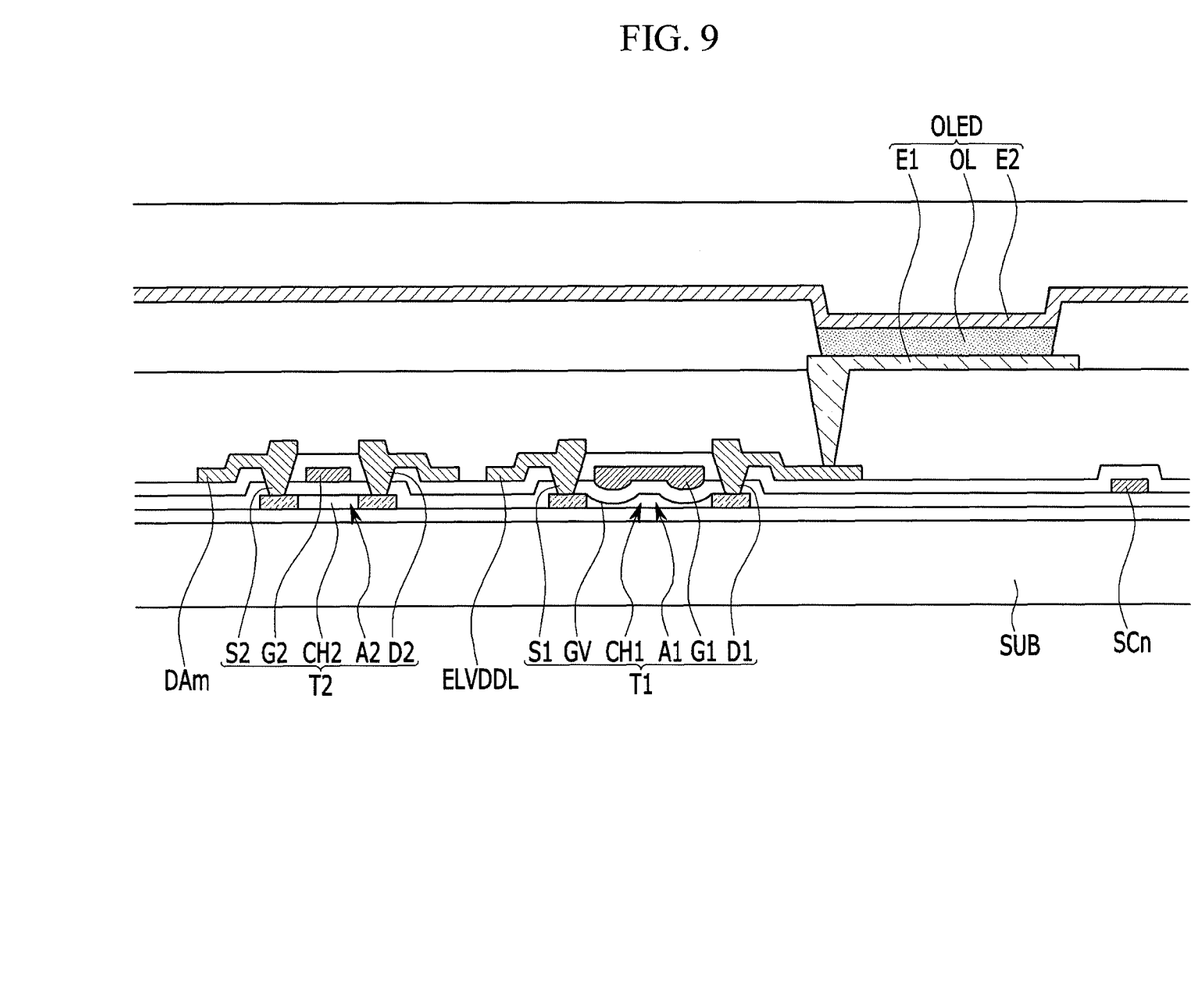

Next, as shown in FIG. 9, the first gate electrode G1, the second gate electrode G2, the first source electrode S1, the first drain electrode D1, the second source electrode S2, and the second drain electrode D2 are formed on the driving active layer A1 and the switching active layer A2 to form the first thin film transistor T1 and the second thin film transistor T2. At this time, the above-described capacitor may be simultaneously formed.

Next, an organic light emitting element (OLED) is formed (S300).

In detail, an insulation layer such as a planarization layer is formed on the first thin film transistor T1, and the first electrode E1 connected to the first thin film transistor T1, an organic emission layer (OL), and the second electrode E2 are sequentially formed thereby forming the organic light emitting element connected to the first thin film transistor T1.

As described above, the second thin film transistor T2 includes the switching channel region CH2 having the flat surface with the decreased channel length compared with the driving channel region CH1 of the first thin film transistor T1 such that the load of the driving current flowing in the pixel PE is minimized. Also, the first thin film transistor T1 substantially controlling the driving current supplied to the organic light emitting element includes the driving channel region CH1 having at least one groove GV to increase the entire channel length of the driving channel region CH1, and when the light emitted from the organic emission layer (OL) of the organic light emitting element according to the driving current flowing in the organic light emitting element is displayed from a black color to a white color, the driving range (DR) of the gate voltage applied to the first gate electrode G1 of the first thin film transistor T1 is wide.

According to at least one of the disclosed embodiments, the grayscales of the light emitted from the organic emission layer are sufficient such that a display quality of an OLED is enhanced.

While the above embodiments have been described with reference to the accompanying drawings, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display comprising:
   a substrate;
   an organic light emitting element positioned over the substrate; and
   a first thin film transistor electrically connected to the organic light emitting element and having a driving channel region, wherein at least one groove is formed in the driving channel region and wherein the groove only partially penetrates the driving channel region.

2. The OLED display of claim 1, further comprising a second thin film transistor electrically connected to the first thin film transistor and including a switching channel region.

3. The OLED display of claim 2, wherein the driving channel region and the switching channel region are positioned on the same layer over the substrate.

4. The OLED display of claim 3, wherein the first thin film transistor further comprises a first gate electrode positioned on the driving channel region and positioned in the groove, and wherein the second thin film transistor further comprises a second gate electrode positioned on the switching channel region.

5. The OLED display of claim 2, wherein
the surface of the switching channel region is substantially flat.

6. The OLED display of claim 1, wherein
the groove has a curved surface.

7. The OLED display of claim 1, wherein
the organic light emitting element comprises:
a first electrode electrically connected to the first thin film transistor;
an organic emission layer positioned over the first electrode; and
a second electrode positioned over the organic emission layer.

8. The OLED display of claim 1, wherein the groove has a substantially semi-circular cross-section.

9. The OLED display of claim 1, wherein the at least one groove includes a plurality of grooves.

10. A method of manufacturing an organic light emitting diode (OLED) display, comprising:
forming a first thin film transistor including a driving channel region on a substrate, wherein at least one groove is formed in the driving channel region and wherein the groove only partially penetrates the driving channel region; and
forming an organic light emitting element electrically connected to the first thin film transistor.

11. The method of claim 10, further comprising forming a second thin film transistor electrically connected to the first thin film transistor and including a switching channel region.

12. The method of claim 11, wherein the first thin film transistor and the second thin film transistor are formed by the same process.

13. The method of claim 10, wherein the groove has a substantially semi-circular cross-section.

14. The method of claim 10, wherein the at least one groove includes a plurality of grooves.

15. A method of manufacturing an organic light emitting diode (OLED) display, comprising:
forming a first thin film transistor including a driving channel region on a substrate, wherein at least one groove is formed in the driving channel region;
forming an organic light emitting element electrically connected to the first thin film transistor; and
forming a second thin film transistor electrically connected to the first thin film transistor and including a switching channel region,
wherein the first thin film transistor and the second thin film transistor are formed by the same process and wherein the forming of the first thin film transistor and the forming of the second thin film transistor include:
forming a driving active layer and a switching active layer over the substrate;
forming a mask insulation layer including an opening positioned corresponding to a position where a groove is formed on the driving active layer and the switching active layer;
dry-etching the driving active layer through the opening to form a preliminary groove at the driving active layer,
dry-etching the driving active layer through the opening to expand the preliminary groove thereby forming the groove; and
removing the mask insulation layer.

16. The method of claim 15, wherein the preliminary groove is formed as a plane, and wherein the groove has a curved surface.

* * * * *